United States Patent [19]

Griswold, Jr. et al.

[11] Patent Number: 4,761,798
[45] Date of Patent: Aug. 2, 1988

[54] BASEBAND PHASE MODULATOR APPARATUS EMPLOYING DIGITAL TECHNIQUES

[75] Inventors: Stanley R. Griswold, Jr.; Bryan G. Mussatti, both of Fort Wayne, Ind.

[73] Assignee: ITT Aerospace Optical, Fort Wayne, Ind.

[21] Appl. No.: 33,144

[22] Filed: Apr. 2, 1987

[51] Int. Cl.[4] ............................................. H04L 27/04
[52] U.S. Cl. ......................................... 375/59; 370/20
[58] Field of Search ....................... 375/50, 59, 60, 52, 375/61; 370/20; 455/208, 214

[56] References Cited

U.S. PATENT DOCUMENTS

| | | | |
|---|---|---|---|
| 4,238,850 | 12/1980 | Vance | 370/24 |
| 4,254,503 | 3/1981 | Vance et al. | 375/8 P |
| 4,291,277 | 9/1981 | Davis et al. | 375/60 |
| 4,462,107 | 7/1984 | Vance | 375/88 |
| 4,480,327 | 10/1984 | Vance | 370/27 |
| 4,521,892 | 6/1985 | Vance et al. | 375/122 |
| 4,523,324 | 6/1985 | Marshall | 455/208 |
| 4,525,835 | 6/1985 | Vance et al. | 455/86 |
| 4,542,534 | 9/1985 | Carson | 455/208 |
| 4,613,976 | 9/1986 | Sewerinson et al. | 375/52 |
| 4,618,967 | 10/1986 | Vance et al. | 455/214 |

Primary Examiner—Robert L. Griffin
Assistant Examiner—Stephen Chin
Attorney, Agent, or Firm—Robert A. Walsh; Thomas N. Twomey; Mary C. Werner

[57] ABSTRACT

There is disclosed a Zero IF modulator apparatus for modulating carrier signals with baseband signals, the modulator includes digital logic circuitry including a sine/cosine amplitude converter which is responsive to the baseband signals for providing first and second digital quadrature baseband signals. These digital quadrature baseband signals are then employed by coupling the same to digital-to-analog converters where the outputs of each converter is indicative of a first and second quadrature signal. These signals can then be translated to a given carrier signal for transmission over a desired communication channel.

24 Claims, 3 Drawing Sheets

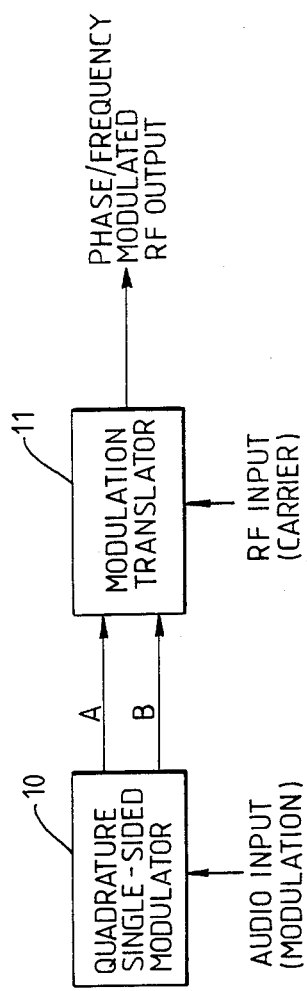
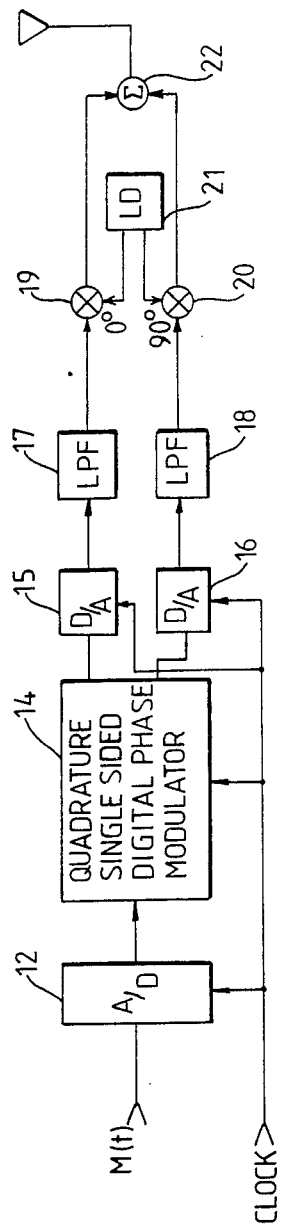

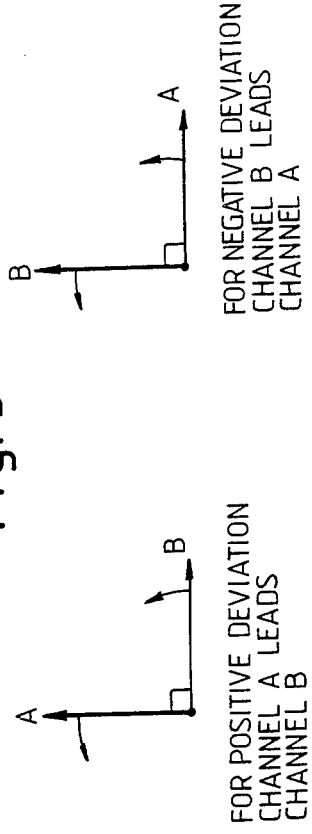
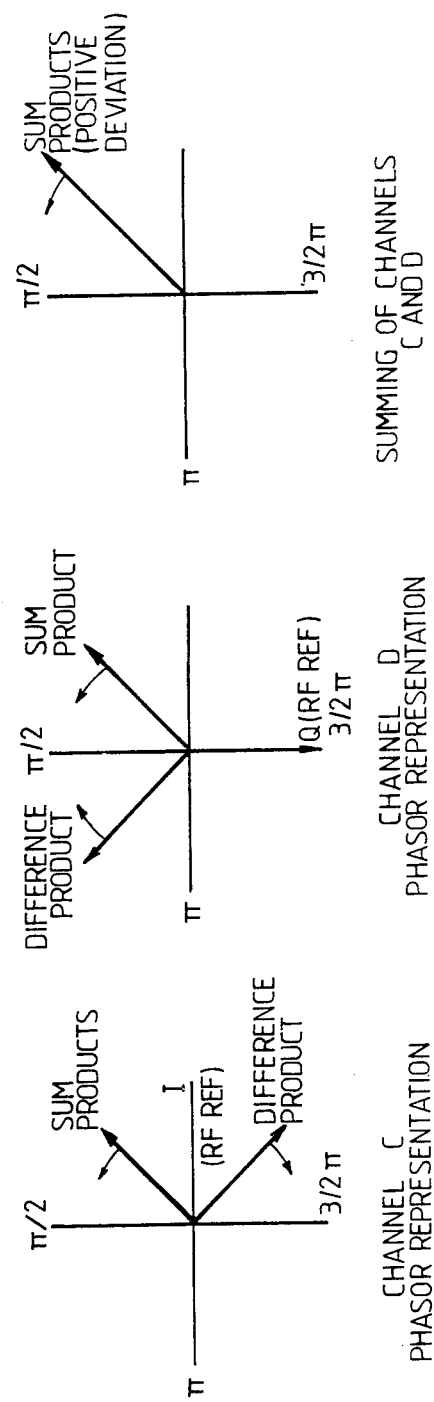
Fig. 5
Fig. 6

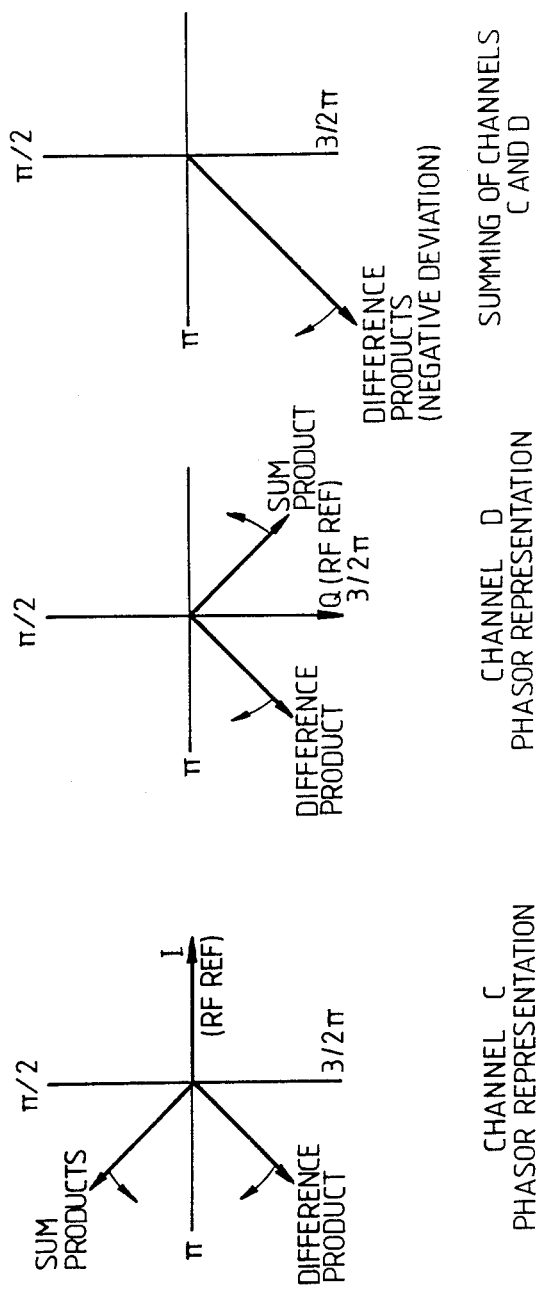

BASEBAND PHASE MODULATOR APPARATUS EMPLOYING DIGITAL TECHNIQUES

BACKGROUND OF THE INVENTION

The present invention relates to phase modulation in general and more particularly to an apparatus and structure for phase or frequency modulating telecommunication carrier signals with baseband signals.

As is well known in the art, baseband signals which contain the information to be transmitted and which will hereafter be referred to as message signals are modulated onto a carrier in order to facilitate or enable transmission over considerable distances.

Various modulation techniques are known including frequency modulation as well as other techniques which essentially employ the zero intermediate frequency (Zero IF) in implementing communication systems.

As is known, there are conventional ways to accomplish phase modulation at a desired carrier frequency. A first way is to modulate a local oscillator or a reference oscillator in a synthesizer loop by the information signal. A second way is to modulate an oscillator at non-zero intermediate frequency which is then translated to the desired carrier frequency by a third frequency. In any event, these methods suffer in the following respects.

In regard to the first method, the ability to maintain a linear relationship between the input signal amplitude and the carrier phase deviation when the carrier frequency is changed is extremely difficult, and secondly, additional complicated control circuitry is necessary to select the proper third frequency and additional radio frequency hardware is required which results in widespread interference problems. The Zero IF phase modulator does not require compensation correction when the RF frequency is changed since its voltage-to-phase function is independent of the RF frequency. The required extra RF circuitry would only be one mixer and a power combiner if the 90 degree of the RF phase shift is provided by the synthesizer (otherwise, a 90 degree power divider is also needed).

As indicated, the Zero IF approach has been widely employed in the prior art. U.S. Pat. No. 4,238,850 issued on Dec. 9, 1980 to R. A. Vance and entitled TRANSMITTER/RECEIVER FOR SINGLE CHANNEL DUPLEX COMMUNICATIONS SYSTEMS describes a transmitter receiver which can be used for a cordless telephone. The receiver produces direct conversion from the radio frequency. The local oscillator frequency is modulated by an audio signal to be sent, the modulated signals being passed through a dual splitting and combining network. As described in this patent, the receiver portion makes use of the Zero IF or direct conversion method of demodulation. Such a method is also described in British specification Ser. No. 1,530,602 published Nov. 1, 1978 to I. A. W. Vance.

U.S. Pat. No. 4,470,147 entitled RADIO RECEIVER WITH QUADRATURE DEMODULATION AND DIGITAL PROCESSING which issued on Sept. 4, 1984 to J. K. Goatcher and is assigned to the International Standard Electric Corp. depicts a radio receiver which divides the radio frequency input into two channels and in each channel mixes it with the carrier wave frequency. A quadrature shift in the mixed carrier wave frequencies enable baseband signals to be filtered from the mixer outputs. Essentially the analog quadrature signals are converted to digital form and processed digitally to reproduce the original modulating signal for AM, FM or PM transmissions. For single sideband modulation the mixing frequency is the sideband center frequency instead of the carrier frequency.

U.S. Pat. No. 4,476,585 entitled BASEBAND DEMODULATOR FOR FM SIGNALS issued on Oct. 9, 1984 to J. Reed and is assigned to the International Telephone and Telegraph Corp. This patent shows a modulator which is employed in a Zero IF system and uses a local oscillator for providing quadrature output signals at the center frequency of an FM signal to be demodulated. The demodulator has first and second mixers for separately mixing the FM signals with the quadrature signals to provide a first and second output signal, each in quadrature at the outputs of the mixers. These signals are low pass filtered. A demodulator is shown which includes third and fourth mixers with each mixer receiving at an input the output of one low pass filter. At another input, the mixers receive the third and fourth signals. The third and fourth signals are derived from mixing a variable controlled oscillator signal with the local oscillator quadrature signal. Essentially, the patent also shows a switching circuit which operates to alternate the third and fourth signals as applied to the input of the third and fourth means as well as the output as applied to the difference amplifier and uses an additional amplifier coupled to the outputs of the mixers so that one can utilize automatic gain control in a Zero IF system.

A particularly pertinent patent is U.S. Pat. No. 4,540,958 entitled ZERO IF FREQUENCY MODULATOR which issued on Sept. 10, 1985 to E. J. Neyens et al. and assigned to the International Telephone and Telegraph Corp. Essentially, this patent describes an apparatus for frequency modulating carriers with baseband signals, and it basically includes an arrangement for generating two quadrature related baseband signals in two separate channels wherein each of the quadrature related baseband signals is a sinusoidal function of the instantaneous angle of the message signal to be transmitted. The apparatus further includes an arrangement for producing a frequency modulated carrier from the quadrature related baseband signals. This arrangement includes a device that provides two quadrature related carrier frequency waveforms, two mixing devices, each for individually mixing one of the quadrature related carrier frequency waveforms with one of the quadrature related baseband signals in one of the channels, and a combining device which combines the output signals from the two channels into a single frequency modulated carrier frequency output signal.

As one can ascertain, there are many patents which relate to Zero IF systems such as U.S. Pat. Nos. 4,476,585; 4,480,327; 4,462,107; 4,488,064; 4,506,262; 4,521,892, 4,525,835, 4,322,851 and 4,254,503. Essentially, the main purpose of such a system is to provide a communication system wherein the amount of tuned circuitry employed is substantially reduced. In obtaining a reduction in the number of tuned circuits, one is therefore able to integrate large portions of the receiver and produce radio receivers which are extremely compact and reliable.

These receivers, as indicated, are employed in many areas such as in selective paging systems and so on. Thus to achieve such advantages, the design of such receivers is implemented according to the Zero IF technique. As indicated, in such a system there is present a receiver in which the local oscillator signals are in phase quadrature at the carrier frequency and are each separately mixed with the incoming audio modulated signals. The resulting signals have Zero IF with the two sidebands folded over on each other at the base band and extending in frequency from DC to the signal sideband width of the original signal.

As one can see from the above cited references, the concentration has mainly been in regard to implementing a receiver design or a transceiver design utilizing baseband circuitry. Baseband circuitry will operate at frequencies where integrated circuit technology is well established and therefore a transceiver which consists primarily of integrated circuits is relatively small and inexpensive. As indicated, the prior art has concentrated mainly in the receiver area of the Zero IF transceiver, and hence the above-noted techniques mainly involve demodulator design as a sine/cosine demodulator or analog methods employing phase locked loops. These approaches are apparent when reference is made to the above-noted patents. In general it is indicated that the transmitter has not received much attention. It is, of course, apparent that in order to obtain the benefits of integrated circuit technology it would be extremely desirable to implement a modulator employing digital techniques. This allows one to use digital IC technology to further reduce cost and improve operation.

Thus it is an object of the present invention to provide a modulator which can be employed in a Zero IF transmitter and which will operate in both phase and frequency modulation modes.

It is a further object to provide a modulator that can be reconfigured as a demodulator for phase modulated signals to thereby provide a simpler and inexpensive transceiver by further having the ability of utilizing common hardware in both the transmit and receive modes.

BRIEF DESCRIPTION OF THE PREFERRED EMBODIMENT

A Zero IF modulator apparatus for modulating carrier signals with a baseband signal comprising digital means including a digital sine/cosine amplitude converter means responsive to said baseband signal for providing at a first output a first digital quadrature baseband signal and for providing at a second output a second digital quadrature baseband signal, first and second digital-to-analog converters with said first converter responsive to said first digital quadrature signal to provide at an output a first quadrature analog signal and with said second converter responsive to said second digital quadrature signal to provide at an output a second quadrature analog signal and, modulation translator means including a carrier oscillator operating at a given frequency, said modulation translator means responsive to said first and second analog quadrature signals for translating said signals to a given carrier frequency.

BRIEF DESCRIPTION OF THE FIGURES

FIG. 1 is simple block diagram showing a Zero IF frequency or phase modulator according to this invention.

FIG. 2 is a detailed block diagram showing a Zero IF phase modulator in a more detailed form.

FIG. 5 is a phasor diagram depicting the Zero IF modulation components.

FIG. 6 is a phasor diagram depicting a channel A signal leading a channel B signal by 90°.

FIG. 7 is a phasor diagram depicting a channel B signal leading a channel A signal by 90°.

DETAILED DESCRIPTION OF THE FIGURES

Figure 3:
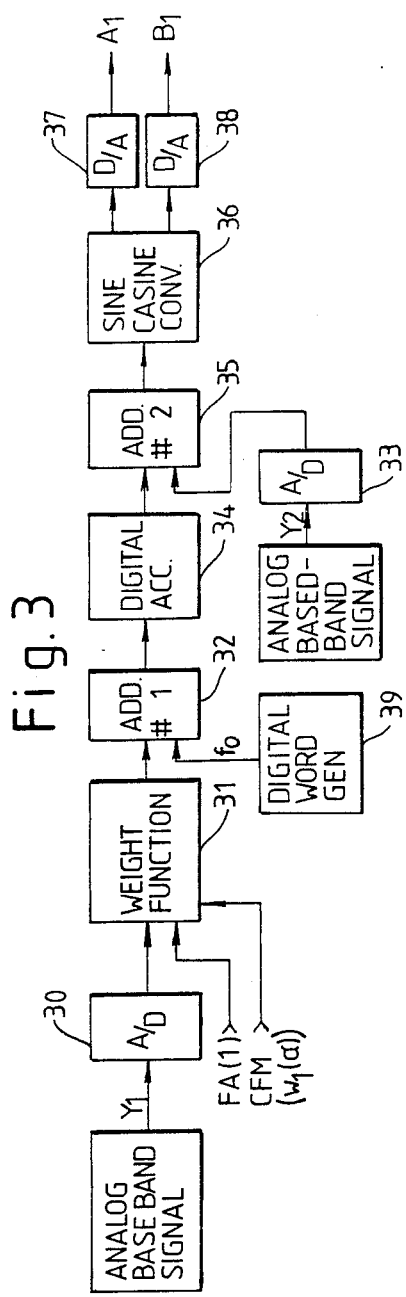
FIG. 3 is a block diagram showing the quadrature single sided digital phase modulator which constitutes a section of the phase modulator according to this invention.

Before proceeding with a description of the Figures, it is indicated that the system to be described is capable of producing various phase modulation (PM) forms from quadrature modulation components at zero intermediate frequency (Zero IF). The modulation components at zero frequency allow direct carrier modulation by a method similar to single sideband (SSB) generation by phase cancellation. As will be explained, phase modulation (PM) carrier is synthesized by using the frequency components of both upper and lower signals for the respective positive and negative deviations of the carrier.

Referring to FIG. 1, there is shown a very general block diagram of a Zero IF phase modulator. If one references U.S. Pat. No. 4,450,958, one will see that the essential block diagram regarding the phase modulator is generally of the same configuration as the frequency modulator as described in terms and operations in the above noted patent.

Essentially, as one can ascertain from FIG. 1, the phase modulator is divided into two sections. The first section is designated as a quadrature single sided modulator 10 which essentially operates to respond to a baseband input signal such as the output of microphone and generates two quadrature baseband signals which contain the components necessary for phase modulation.

The second section 11 is referred to as a modulation translator. The function of the modulation translator 11 is to translate the baseband signals (A and B) for any desired RF frequency which is provided by the local oscillator input, shown in FIG. 1 as the RF input or carrier input. The quadrature single-sided modulator 10 provides amplitude-to-phase conversion of the input message signal which is the audio input in quadrature output form.

As an example, consider frequency modulation which is a form of phase modulation. This, of course, is indicated and explained in the above-noted U.S. Pat. No. 4,450,958. Mathematically, this can be accomplished by taking both the sine and cosine of the integral of the message signal. For simplicity, let the message signal be a sinewave, then:

$$m(t) = A \sin w_m t$$

where:
m(t) is the message signal
A is the amplitude constant
$w_m$ is the radian frequency $$\theta_m(t) = C \int_{-\infty}^{t} m(t) \, dt$$

where:

$\theta_m(t)$ is the instantaneous FM angle
C is the frequency deviation constant Taking the sine and cosine of $\theta_m(t)$ provides the quadrature outputs:

$$A = \sine \theta_m(t)$$

$$B = \cos \theta_m(t)$$

The modulation translator is effectively a phase modulator which mathematically can be represented by quadrature forms of the RF carrier multiplied by the two zero frequency modulation signals and then combined such that:

$$X(t) = X_o \sine w_c t \cos \theta_m(t)$$

where:
X(t) is the frequency modulated carrier
$X_o$ is the carrier amplitude
$w_c$ is the carrier frequency Let $X_o = 1$ and then when $\theta_m(t)$ is a positive value:
sine $w_c t$ sine $\theta_m(t) = \frac{1}{2}[\cos (w_c t - \theta_m(t)) - \cos (w_c t + \theta_m(t))]$ and $$\cos w_c t \cos \theta_m(t) = \frac{1}{2}[\cos (w_c t - \theta_m(t)) + \cos (w_c t + \theta_m(t))]$$

then:

$$X(t) = \cos(w_c t - \theta_m(t))$$

When $\theta_m(t)$ is a negative value:

sine $w_c t$ sine $\theta_m(t) = \frac{1}{2}[\cos (w_c t - \theta_m(t)) - \cos (w_c t + \theta_m(t))]$ $\cos w_c t \cos \theta_m(t) = \frac{1}{2}[\cos (w_c t - \theta_m(t)) + \cos (w_c t + \theta_m(t))]$ then:

$$X(t) = \cos (w_c t + \theta_m(t))$$

This illustrates the manner in which the instantaneous phase of the RF carrier is dependent on the instantaneous phase of the baseband FM signal.

Again, reference is made to U.S. Pat. No. 4,540,958 entitled ZERO IF FREQUENCY MODULATOR. As one can ascertain from that patent, there is shown an analog method for producing frequency modulated signals suitable for a Zero IF frequency modulator. In any event, there are certain disadvantages of the technique described in the patent. These include the requirement for two analog voltage control oscillators and a phase-locked loop to implement the Zero IF modulated signal as well as a requirement for passive elements to produce signals which are 90° out of phase with one another.

The prior art technique, as described in that patent, strictly relates to frequency modulated signals. As above indicated, in order to reduce the size and complexity of modulators, one preferably would desire to implement such a modulator utilizing conventional digital circuitry thereby allowing the use of relatively inexpensive integrated circuit components. As indicated, the above-noted patent has disadvantages in that it absolutely requires the use of analog components.

Referring to FIG. 2, there is shown a block diagram of a phase modulator for a Zero IF system.

As seen from FIG. 2, an input signal is directed to the input of an analog-to-digital converter 12. The analog-to-digital converter provides a digital output which is coupled to an input of a quadrature single-sided digital phase modulator 14. The output from the quadrature digital phase modulator 14 consists of two quadrature signals which are directed to digital-to-analog converters 15 and 16. The analog outputs from each converter is then processed through a corresponding low pass filter as 17 and 18 which outputs are directed to first inputs of mixers 19 and 20. The mixers 19 ad 20 receive a local oscillator signal from oscillator 21.

As shown in FIG. 2, mixer 19 receives the oscillator signal at 0° phase while mixer 20 receives the local oscillator signal at 90° phase. The outputs from the mixers are combined in a summer 22 which as will be explained produces a phase modulated output signal. As will be further explained, the components shown in FIG. 2, are implemented by the use of digital circuitry. Essentially, the Zero IF phase modulator of FIG. 2 can again be divided into two sections.

Figure 4:
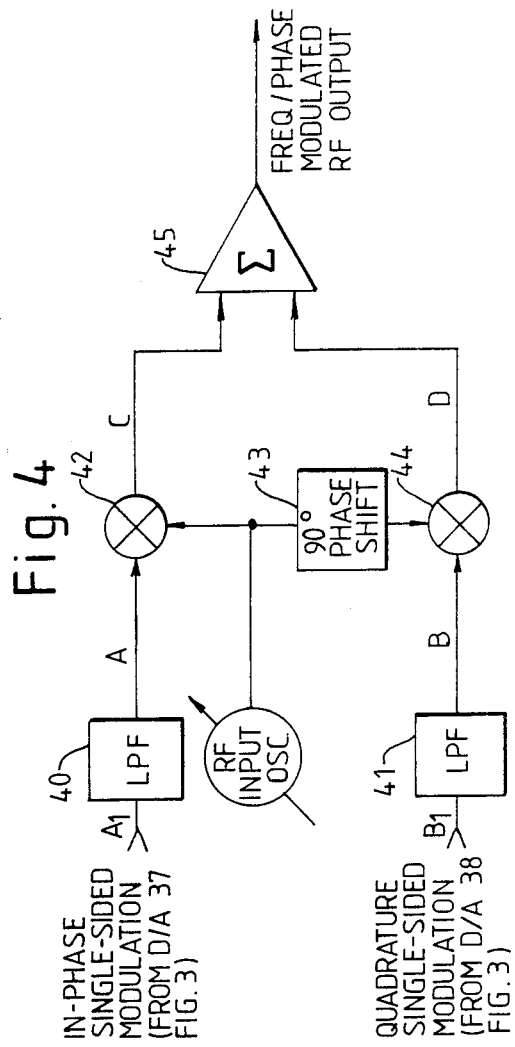
FIG. 4 is a block diagram showing the modulation translator section of the phase modulator according to this invention.

The first section is the quadrature single-sided modulator which is shown in FIG. 3 in greater detail and the modulation translator which is shown in FIG. 4 in greater detail. As one can ascertain, the sections are also designated in FIG. 1 as section 10 and section 11, namely, the quadrature single-sided modulator and the modulation translator.

Referring to FIG. 3, there is shown a block diagram of the quadrature single-sided digital phase modulator. Before proceeding with a description of operation in regard to FIG. 3, it is indicated that the circuit shown is capable of generating the following forms of phase modulated signals.

(1) Phase Modulation:

$$\theta_m(t) = K_p m(t)$$

where $K_p$ is the peak phase deviation (2) Frequency Modulation:

$$\theta_m(t) = C \int^t m(\alpha) \, d\alpha$$

where C is the peak frequency deviation and (3) Complex Frequency Modulation:

$$\theta_m(t) = C \int^t w_1(\alpha) m(\alpha) d$$

where $w_1(\alpha)$ is a weighting function.

In order to explain operation of the quadrature single-sided digital phase modulator, reference will be made to the various modulation modes capable of being implemented by the modulator. For frequency modulation a message signal is applied to the input port Y1 which essentially is the input to the analog-to-digital converter 30. Analog-to-digital converters as A/D 30 are well known in the art, and there are many examples of suitable circuitry which will suffice. In any event, a digital word designated by $f_0$ is set to all zeros and the input to analog-to-digital converter 33 which is designated as $y_2$ is also at zero volts. This is necessary to implement frequency modulation.

Hence for frequency modulation operation, $y_1$ is the message signal, $y_2$ which is the input to A/D converter 33 is set to zero and the digital word which is the input to the adder 32 is at all zeros. The input signal at $y_1$ is converted to a digital word of a suitable number of bits in the A/D converter 30. The output digital word from converter 30 is applied to a weighting function module 31. The weighting function module 31 essentially is a digital multiplier. Examples of digital multipliers are also well known and many such devices exist as commercial integrated circuits. Hence as indicated, the output signal from the analog-to-digital converter 30 is applied to one input of the weighting function module 31 which has stored therein the weighting function $w_1$. For conventional FM $w_1$ is equal to 1. Thus the output of the weighting function module 31 provides one input to the adder 32.

The adder 32 again is a conventional integrated circuit and basically operates to provide a digital sum at an output representing the sum of the digital signals at the input. As one can ascertain, since the digital word which is $f_o$ has been defined to be zero, the input of adder 32 is passed directly to the input of a digital accumulator or phase accumulator 34. Accumulators are also well known integrated circuits, and for example, such devices are contained in microprocessors and other conventional integrated circuitry.

The accumulator 34 performs the integration function and provides a first input to adder 35. The input is of the form of $\theta_m(t) = C\int w_1(\alpha)m(\alpha)d\alpha$. As above indicated, adder 35 receives the above-noted signal at one input. The second input signal to the adder 35 is derived from the analog-to-digital converter 33. In any event, the input to the analog-to-digital converter is at zero volts for implementing frequency modulation. Hence the signal which emanates from the phase accumulator 34 is passed directly through the adder 35 to the input of module 36 designated as a sine/cosine function converter.

A sine/cosine amplitude converter essentially is a read only memory (ROM). Such devices are also well known and many examples exist in the commercial field. The sine and cosine generator provides the quadrature output signals which are applied to respective digital-to-analog converters as 37 and 38. Thus the output of the D/A converters provides the two quadrature output signals, namely, signals A and B which after low pass filtering have the following format.

$$A = \text{sine } [\theta_m(t)]$$

and $$B = \text{cosine } [\theta_m(t)]$$

As seen from FIG. 4, the low pass filters are designated as 40 and 41 and essentially receive the input signals A and B from the digital-to-analog converters 37 and 38 of FIG. 3. The outputs of the low pass filters 40 and 41 have the above-noted format as defined by the above-noted equations. Essentially, the low pass filter operates to remove unwanted frequency components which are due to the clock rate employed in digital-to-analog conversion.

The filtered signals are then passed to the modulation translator which essentially consists of mixers 42 and 44. Each mixer receives the respective signal as the A and B signal from low pass filters 40 and 41. As seen, mixer 42 receives the RF input or carrier signal which is directly applied at 0° phase to one input port, while mixer 44 receives the RF input signal as shifted by 90° based on the phase shifter 43. The outputs from the mixers designated by reference letters C and D are applied to an output summer 45 whose output contains the frequency modulated or phase modulated RF output.

The filtered signals which are passed to the modulator translator circuit of FIG. 4 modulate the RF carrier to provide the following:

$$X(t) = \text{sine}\left[w_c t + c \int_{-\infty}^{t} m(\alpha)d\alpha\right]$$

If m(t) is an analog message, the output takes the form $$X(t) = \text{sine}\left[w_c t + AC \int_{-\infty}^{t} \text{sine } w_m t\right]$$

or $$X(t) = \text{sine}\left[w_c t + \frac{F_p}{\omega_m} \cos w_m t\right]$$

where, $$m(t) = A\text{sine } w_m t$$

$$F_p = AC = \text{Peak Frequency Deviation}$$

and $\frac{F_p}{\omega_m}$ = Modulation Index

For a digital data stream, the output becomes, $$X(t) = \text{sine}\left[w_c t + AC \int_{-\infty}^{t} m(\alpha)d\alpha\right]$$

or $$X(t) = \text{sine } [w_c t + ACt]$$

where, $$m(t) = Ad(t), d(t) = \pm 1$$

and, $F_p = AC$ = Peak frequency deviation.

If $f_o$ is not set to all zero's, the input to adder 32 will be:

$$\theta_m(t) = C\int_{-\infty}^{t} w_1(\alpha)m(\alpha)d\alpha + C\int f_o d\alpha$$

which after up-conversion yields $$X(t) = \text{sine } [w_c t + Cf_o t + C^T w_1(\alpha)m(\alpha)d\alpha]$$

This illustrates the capability to add frequency offsets to the modulated carrier. The effective carrier frequency in this case is $(w_c + Cf_o)t$. This frequency offset may be used to deliberately offset the carrier to reduce the effects of in-band interference. It is also used to compensate for local oscillator frequency drift over time and temperature by adding the appropriate frequency correction term.

It is also possible to directly generate frequency modulated signals without the use of the modulation translator of FIG. 4. In this case, the modulated output signal is either signal A or B in FIG. 3 where $$A = \text{sine } [\theta_m(t)] = \text{sine } [Cf_o t + C' \int w_1(\alpha) m(\alpha) d\alpha]$$

In this case, the carrier frequency is now the $Cf_o$ term. This application becomes increasingly more attractive as the speed of digital circuitry continues to increase, allowing higher and higher carrier frequencies to be directly generated. A digital word generator 39 which may be a shift register or counter supplies the suitable input to adder 32 to implement a desired operation.

Again, referring to FIG. 3, the next operation to be described is the phase modulation operation of the quadrature single-sided digital phase modulator. For phase modulation, the input digital word $f_0$ and input at $y_1$ are both set to zero and the input message is applied to port $y_2$ associated with the analog-to-digital converter 33. The input waveform is converted to digital form by the analog-to-digital converter 33 and presented as an input to adder 35. Since the digital word $f_o$ and $y_1$ are both zeros in the phase modulation mode, the input at adder 35 is passed directly to the sine/cosine amplitude converter 36. The outputs of sine/cosine function converter after digital-to-analog conversion as afforded by the D/A converters 37 and 38 and after applying the outputs from the digital-to-analog converters to the low pass filters 40 and 41 are represented as follows:

$$A = \text{sine } [\theta_m(t)]$$

and $$B = \text{cosine } [\theta_m(t)]$$

where $$\theta_m(t) = K_p m(t).$$

These baseband quadrature modulated components are then passed to the modulator translator of FIG. 4 where they modulate the RF carrier to provide the following:

$$X(t) = \text{sine } [w_c t + K_p m(t)].$$

Note that this architecture is valid for both analog and digital message waveforms. For example for $m(t) = \text{sine } w_m t$, $$X(t) = \text{sine } [w_c t + K_p \text{ sine } w_m t],$$

while for $m(t) = \pm 1$, $K_p = \pi/2$, $$X(t) = \text{sine } [w_c t + m(t) \cdot \pi/2]$$

which is nothing more than the bi-phase shift keying (BPSK) modulated signal. Note that the peak phase deviation can be set easily and accurately to any size from $2\pi$ to $2\pi/K$, where K is the number of digital bits which address the sine/cosine converter 36. This makes M-ary PSK modulation very easy to implement with precise phase control of each phase state to be transmitted.

Again, referring back to FIG. 3, operation to perform complex frequency modulation is as follows. In this mode the inputs $f_0$ and $y_2$ are set to zero and the message waveform is applied to input port $y_1$. The waveform at $y_1$ is again converted to digital form by the analog-to-digital converter 30 and passed to the weighting function block. The weighting function block 31 multiplies the digital signal emanating from the A/D converter 30 by a factor $w_1(t)$. Since $f_0$ has been set to zero, this signal passes directly through adder 32 and is accumulated in the digital accumulator 34 to give the following output:

$$\theta_m(t) = C \int_{-\infty}^{t} m(\alpha) w_1(\alpha) d\alpha$$

The output from the accumulator 34 is applied to one input of adder 35. In any event, since $y_2$ has been set to zero adder 35 passes the output of accumulator 34 directly to the sine and cosine generator or converter 36. Again, the outputs from the sine and cosine generator 36 are converted by means of digital-to-analog converter 37 and 38 to analog signals whose outputs are then applied to the low pass filters 40 and 41 associated with the modulation translator of FIG. 4. The signals A and B at the outputs of the low pass filters 40 and 41 are given by the following equations:

$$A = \text{sine} \left[ C \int_{-\infty}^{t} m(\alpha) w_1(\alpha) d\alpha \right]$$

and $$B = \text{cosine} \left[ C \int_{-\infty}^{t} m(\alpha) w_1(\alpha) d\alpha \right]$$

The low pass filters, as indicated, are utilized to remove the clock rate components associated with the digital-to-analog conversion as well as alias spurious components. The signals as A and B are then passed to the modulator translator mixers where they modulate the RF carrier to produce the following signal:

$$X(t) = \text{sine} \left[ w_c t + C \int_{-\infty}^{t} m(\alpha) w_1(\alpha) d\alpha \right]$$

The utility of this architecture can be seen by choosing m(t) as digital data with values of $+1$ or $-1$ and $$w_1(\alpha) = \frac{\pi t}{2T}$$

where $1/T$ = the data rate of the data stream. This choice of $w_1$ will give $$X(t) = \text{sine } [w_c t + m(t) \cdot \pi t / 2T]$$

which is the mathematical description for the minimum (frequency) shift keyed (MSK) modulated waveform. This modulated waveform has the major attributes of good spectral efficiency in terms of transmitted bit rate per hertz of bandwidth and a very steep out-of-band frequency roll off of $f^{-4}$ compared to $f^{-2}$ for BPSK.

Other choices of $w_1(\alpha)$ can be made to generate modulated waveforms known as correlative digital frequency modulation which have even higher spectral efficiencies than that of the MSK waveform generated above.

The modulation translator section of the Zero IF frequency modulator imposes the baseband signals of the RF input or carrier which is also the local oscillator frequency. Thus the modulator translator as shown in FIG. 4 employs direct carrier modulation which is accomplished by mixing the quadrature components of the modulation at zero frequency with the quadrature components of the carrier frequency and summing the outputs of the two mixers via the summing circuit 45. This, as indicated, is shown in FIG. 4.

The outputs labeled C and D which are the outputs of the respective mixers 42 and 44 contain both the sum and different products of the input phase components. The unique relationship of the quadrature components at the zero and carrier frequency causes a phase cancellation of either the sum or difference product as a function of the phase of the A and B channels.

FIG. 5 depicts phasor diagrams indicative of the Zero If modulation components.

Referring to FIGS. 6 and 7, there is respectively shown the phasor diagrams which in the case of FIG. 6 are phasor diagrams which represent when channel A leads channel B by 90°. The phasor diagrams of FIG. 7 represent the condition when channel B leads channel A by 90°. Thus as one can see from FIGS. 6 and 7, the phasor representations show only a possible relationship between the reference RF quadrature component and the phase of the sum and difference products. However, the phase relationship between the two sum products as well as that between the difference products is precise.

This relationship is a function of the phase of the quadrature modulation signals and causes a summing of one and a canceling of the other product as shown by the phasor diagrams of FIGS. 6 and 7.

Hence as one can ascertain from the above description, the modulator which has been described uses mainly available digital integrated circuits and hence reduces the size of any transceiver in which the modulator is employed. The modulator can also be reconfigured as a demodulator for phase modulated signals to provide a lower cost and size in the transceiver by also employing common hardware in both the transmit and receive modes. It is apparent that the above technique has extreme advantages over those disclosed in the prior art and is applicable in many different types of systems. It is also understood that a Zero IF digital phase modulator, as described above, is also an extremely desirable component for use in a radio transmitter or for use in a conventional transceiver.

The above described techniques allow one to employ conventional digital components and hence implement the entire design by means of digital integrated circuits thus resulting in increased reliability and reduced costs while providing efficient circuit operation.

We claim:

1. A Zero IF modulator apparatus for modulating RF carrier signals with baseband signals and operative to perform phase or frequency modulation, comprising:

first and second analog-to-digital converters each having a separate input adapted to receive an analog baseband signal and each having a separate output for providing a digital signal indicative of the analog baseband signal applied to said input, a weighting function generator means having an input coupled to the output of said first analog-to-digital converter and operative to provide at an output said digital signal at the output of said first analog-to-digital converter as multiplied by a given weighting function, a digital sine/cosine amplitude converter means having an input and operative to provide at a first output a first digital quadrature baseband signal and to provide at a second output a second digital quadrature baseband signal, adding means having one input coupled to the output of said weighting function generator means and another input coupled to the output of said second analog-to-digital converter with the output of said adding means coupled to the input of said sine/cosine amplitude converter means wherein said sine/cosine converter can receive a digital baseband signal from either said first or second converters, a first digital-to-analog converter coupled to said first output of said sine/cosine converter means to provide at an output a first analog quadrature signal, a second digital-to-analog converter coupled to said second output of said sine/cosine converter means to provide at an output a second analog quadrature signal, and modulation translation means including a carrier oscillator operating at a given frequency, said modulation translation means responsive to said first and second analog quadrature signals for translating said signals to a given carrier frequency.

2. The Zero IF modulator apparatus according to claim 1 wherein said weighting function generator means includes a first adder having one input coupled to the output of said weighting function generator and one input coupled to the output of a digital word generator to provide at an output said weighting function generator means output signal as added to said digital word generator signal, a digital accumulator having an input coupled to the output of said weighting function generator means and operative to provide an integrated digital signal at the output with the output of said accumulator coupled to said adding means.

3. The apparatus according to claim 1 wherein said weighting function generator means is a multiplier operative to multiply said digital signal at the output of said first analog-to-digital converter by a given weighting function.

4. The Zero IF modulator apparatus according to claim 1, wherein said sine/cosine amplitude converter is a read only memory (ROM).

5. The Zero IF modulator apparatus according to claim 3, wherein said weighting function of said multiplier is equal to one to provide conventional FM modulation.

6. The Zero IF modulator apparatus according to claim 3, wherein said weighting function is of the form to provide complex frequency modulation.

7. The Zero IF modulator apparatus according to claim 1, further including a first low pass filter having an input coupled to the output of said first digital-to-analog converter with the output of said first low pass filter coupled to an input of said modulation translation means, and a second low pass filter having an input coupled to the output of said second digital-to-analog converter with the output of said second low pass filter coupled to an input of said modulation translation means.

8. The Zero If modulator apparatus according to claim 7, wherein said modulation translation means includes first and second mixers, each having first and second inputs and an output, with the first input of the first mixer coupled to said output of said first low pass filter and with the first input of said second mixer coupled to the output of said second low pass filter, with a source of carrier signals operative at a given frequency and coupled to said second inputs of said mixers, of summing means having first and second inputs coupled respectively to the outputs of said mixers to provide at the output of said summing means and modulated carrier signal.

9. The Zero IF modulator apparatus according to claim 8, further including a 90° phase shifter having an input coupled to said carrier signal source for shifting the phase thereof by 90° and having an output coupled to said first input of said first mixer.

10. A Zero IF modulator apparatus for modulating RF carrier signals with baseband signals and operative to perform phase or frequency modulation, comprising:
first and second analog-to-digital converters, each having a separate input adapted to receive an analog baseband signal, and each having a separate output for providing a digital signal indicative of the analog baseband signal applied to said input,
a weighting function generator means having an input coupled to said output of said first analog-to-digital converter and operative to provide at an output a said digital signal at the output of said first analog-to-digital converter as multiplied by a given weighting function,
digital accumulator means having an input coupled to the output of said weighting function generator means and operative to provide at an output an integrated digital signal,
first adding means having one input coupled to the output of said digital accumulator means and another input coupled to the output of said second analog-to-digital converter, said adding means having an output,
sine/cosine converter means having an input coupled to the output of said adding means and operative to provide at a first output a first digital quadrature signal and at a second output a second digital quadrature signal,
a first digital-to-analog converter coupled to said first output of said sine/cosine converter means to provide at an output a first analog quadrature signal,
a second digital-to-analog converter coupled to said second output of said sine/cosine converter means to provide a second analog quadrature signal,
first mixing means having a first input responsive to said first analog quadrature signal and having a second input and an output,
second mixing means having a first input responsive to said second analog quadrature signal, and having a second input and an output,
means for applying a source of carrier signals to said second inputs of said first and second mixers to provide at said outputs first and a second modulated signals and,
means coupled to said outputs of said mixers to combine said first and second modulated signals to provide an output modulated signal for transmission over a communications link, said modulated signal being modulated according to which analog-to-digital converter receives said baseband signal.

11. The Zero IF modulator according to claim 10, further including second adding means having one input coupled to the output of said weighting function generator and a second input adapted to receive a digital word for defining a modulation mode, with the output of said second adding means coupled to the input of said accumulator.

12. The Zero IF modulator according to claim 10, further including means coupling said analog baseband signal to the input of said first analog-to-digital converter to provide said output modulated signal containing frequency modulation.

13. The Zero IF modulator according to claim 10, further including means coupling said analog baseband signal to said input of said second analog-to-digital converter to provide said output modulated signal containing phase modulation.

14. The Zero IF modulator according to claim 10, further including first and second low pass filters each having an input and an output, with the input of said first filter coupled to the output of said first digital-to-analog converter and with the output of said first filter coupled to said first input of said first mixer, with the input of said second filter coupled to the output of said second digital-to-analog converter and with the output of said second filter coupled to said first input of said second mixer.

15. The Zero IF modulator according to claim 10, further including a phase shifter coupled to said source of carrier signals for shifting the phase of said carrier signal as applied to one of said mixers as compared to the phase of said signal as applied to said other mixer.

16. The Zero IF modulator according to claim 14, wherein said phase shift is relatively 90°.

17. The Zero IF modulator according to claim 10, wherein said weighting function generator means is a digital multiplier.

18. The Zero IF modulator according to claim 10, wherein said sine/cosine converter is a read only memory (ROM).

19. The Zero IF modulator according to claim 10, wherein said means coupled to said outputs of said mixers includes a summing circuit having an output coupled to an antenna.

20. A Zero IF modulator apparatus for modulating carrier signals with baseband signals, comprising:
a first analog-to-digital converter for converting a baseband signal at an input to a digital signal,
accumulator means including a first adder coupled to the output of said first analog-to-digital converter to provide at an output an integrated digital signal, with said first adder having one input adapted to receive a digital word signal for selecting a mode of modulation operation,
means including a second adder having one input coupled to the output of said accumulator means and another input adapted to be coupled to a digital signal source and adapted to convert said integrated digital signal to first and second quadrature signals.

21. The Zero IF modulator according to claim 20, further including a weighting function generator having an input coupled to the output of said first analog-to-digital converter and having an output coupled to another input of said first adder, to cause said adder to provide a summed output.

22. The Zero IF modulator according to claim 21, wherein said second adder has another input coupled to the output of a second analog-to-digital converter.

23. The Zero IF modulator according to claim 20, wherein said means including a second adder further includes a sine/cosine converter means adapted to receive said integrated digital signal for converting the same to said first and second quadrature signals at first and second outputs.

24. The Zero IF modulator according to claim 23, wherein said sine/cosine converter means has a first digital-to-analog converter coupled to said first output to provide a first quadrature analog signal and a second digital to analog converter coupled to said second output to provide said second quadrature analog signal.

* * * * *